United States Patent
Pyo et al.

(10) Patent No.: US 8,349,416 B2
(45) Date of Patent: Jan. 8, 2013

(54) DONOR FILM AND METHOD OF MANUFACTURING ORGANIC LIGHT EMITTING DEVICE USING SAME

(75) Inventors: Sang-Woo Pyo, Suwon-si (KR); Jin-Woo Park, Suwon-si (KR); Myung-Jong Jung, Suwon-si (KR); Sok-Won Noh, Suwon-si (KR); Beom-Joon Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 481 days.

(21) Appl. No.: 12/543,638

(22) Filed: Aug. 19, 2009

(65) Prior Publication Data

US 2010/0048084 A1 Feb. 25, 2010

(30) Foreign Application Priority Data

Aug. 20, 2008 (KR) .................. 2008-81364

(51) Int. Cl.
*H01J 9/00* (2006.01)
*B32B 3/24* (2006.01)
(52) U.S. Cl. .................. 428/32.6; 428/137; 445/23
(58) Field of Classification Search .................. 428/32.6, 428/137; 445/23
See application file for complete search history.

(56) References Cited

FOREIGN PATENT DOCUMENTS

| JP | 2005-149823 | 6/2005 |
|---|---|---|
| KR | 10-0611145 | 8/2006 |
| KR | 10-0761074 | 9/2007 |

OTHER PUBLICATIONS

Machine Translation of KR 10-2006-0020032.*
Machine Translation of JP 2005-149823.*
Machine Transaltion of KR 10-2005-0050492.*
Korean Registration Determination Certificate dated Sep. 29, 2010, issued in corresponding Korean Patent Application No. 10-2008-0081364.
English-language abstract of Korean Publication No. 10-2005-0050492.
English-language abstract of Korean Publication No. 10-2006-0020032.

* cited by examiner

*Primary Examiner* — Gerard Higgins
*Assistant Examiner* — Sathavaram I Reddy
(74) *Attorney, Agent, or Firm* — Christie, Parker & Hale, LLP

(57) ABSTRACT

A donor film and a method of manufacturing an organic light emitting device using the donor film. The donor film having a stack structure includes: a first layer comprising first transfer portions comprising a light emitting material of a first color, and first opening portions; a second layer that is formed on the first layer and comprising second transfer portions corresponding to the first opening portion and further comprising a light emitting material of a second color, and second opening portions; and a third layer that is formed on the second layer and comprising third transfer portions corresponding to the first and second opening portions and further comprising a light emitting material of a third color, and third opening portions.

37 Claims, 5 Drawing Sheets

DONOR FILM AND METHOD OF MANUFACTURING ORGANIC LIGHT EMITTING DEVICE USING SAME

CROSS-REFERENCE TO RELATED APPLICATION

This application claims the benefit of Korean Patent Application No. 10-2008-0081364, filed Aug. 20, 2008 in the Korean Intellectual Property Office, the disclosure of which is incorporated herein by reference.

BACKGROUND OF THE INVENTION

1. Field of the Invention

Aspects of the present invention relate to a donor film and a method of manufacturing an organic light emitting device using the donor film, and more particularly, a donor film whose organic light emitting layer can be easily formed and a method of manufacturing an organic light emitting apparatus using the donor film.

2. Description of the Related Art

Recently, conventional display apparatuses are being replaced with portable, thin flat panel display apparatuses. Among the flat panel display apparatuses, an electroluminescent display apparatus, which is a self-emissive display apparatus, has a wide viewing angle and high contrast ratio, and also high response speed, thus being considered as a next-generation display apparatus. In addition, an organic light-emitting display apparatus having a light emitting layer formed of an organic material has improved properties in terms of brightness, driving voltage, and response speed, and can realize multiple colors in comparison to an inorganic light emitting display apparatus.

An organic light emitting display apparatus includes a plurality of organic light emitting devices, including a cathode electrode, an anode electrode, and an organic light emitting layer. When an organic light emitting diode is driven by applying a voltage to the cathode electrode and the anode electrode, visible light rays are generated by the organic light emitting layer.

An organic light emitting layer may have two or three colors and thus can be used in a color display apparatus. An organic light emitting layer may be formed using various methods, and is usually formed using a deposition method or a thermal transfer method because wet patterning is difficult due to the characteristics of organic materials.

When an organic light emitting layer is formed using a conventional thermal transfer method, donor films are prepared individually for each color and then heated to form the organic light emitting layer. For example, after red, green, and blue films are prepared and respectively sequentially transferred, a transfer process is performed three times. Accordingly, the overall manufacturing process is complicated and materials may remain on the color films after the transfer process of each color and affect the next transfer process of other color films. Also, it is not easy to transfer the films after aligning them, and thus sub-pixels which are formed of each of the donor films cannot be arranged at precise positions.

SUMMARY OF THE INVENTION

Aspects of the present invention provide a donor film and a method of manufacturing an organic light emitting device using the donor film, capable of forming an organic light emitting layer easily.

As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present.

Additionally, it will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

According to an aspect of the present invention, there is provided a donor film, having a stacked structure, comprising: a first layer comprising first transfer portions comprising a light emitting material of a first color, and first opening portions; a second layer that is formed on the first layer and comprising second transfer portions corresponding to the first opening portion and further comprising a light emitting material of a second color, and second opening portions; and a third layer that is formed on the second layer and comprising third transfer portions corresponding to the first and second opening portions and further comprising a light emitting material of a third color, and third opening portions.

The second opening portions and the third opening portions may be disposed on the first layer in the stacked direction of the donor film, the third opening portions may be disposed on the second layer, the first opening portions may be disposed under the second layer, and the first opening portions and the second opening portions may be disposed under the third layer.

The first transfer portions, the second transfer portions, and the third transfer portions may be formed to not overlap with each other in the stacked direction of the donor film.

The first transfer portions may be patterned in stripes having first predetermined distances from one another and the first opening portions may be disposed in the space between the first transfer portions, the second transfer portions may be patterned in stripes having second predetermined distances from one another and the second opening portions may be disposed in the space between the second transfer portions, and the third transfer portions may be patterned in stripes having third predetermined distances from one another and the third opening portions may be disposed in the space between the third transfer portions.

According to another aspect of the present invention, there is provided a method of manufacturing an organic light emitting device, the method comprising: preparing the donor film, having a stacked structure, of claim 1; arranging the donor film on a substrate including first electrodes so that the donor film faces the first electrodes; forming an intermediate layer by heating the donor film and transferring the first transfer portions, the second transfer portions, and the third transfer portions of the donor film; and forming a second electrode on the intermediate layer.

The second opening portions and the third opening portions may be disposed on the first layer in the stacked direction of the donor film, the third opening portions may be disposed on the second layer, the first opening portions may be disposed under the second layer, and the first opening portions and the second opening portions may be disposed under the third layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
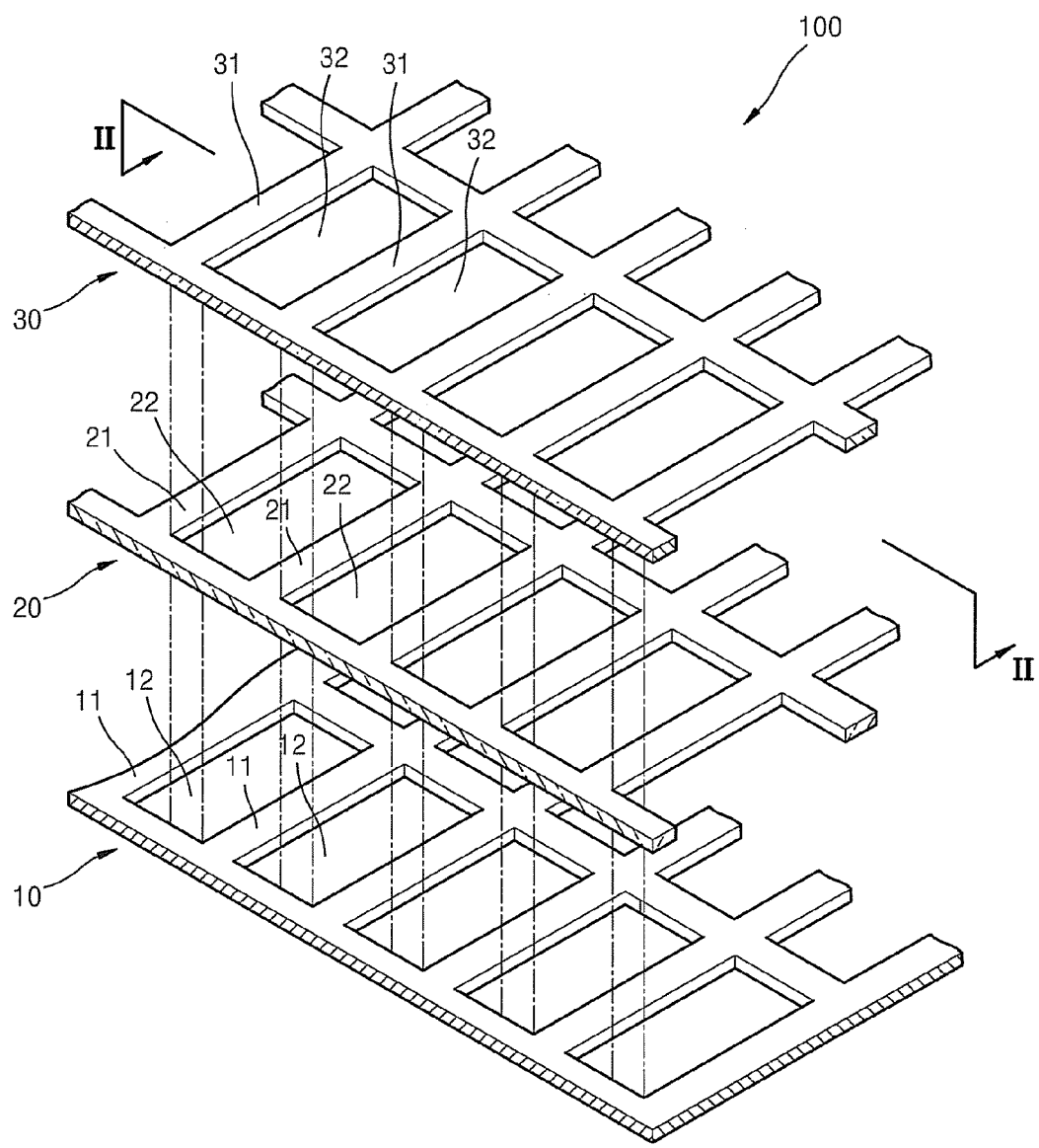
FIG. 1 is a dissembled perspective view of a donor film according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present.

Additionally, it will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Figure 2:
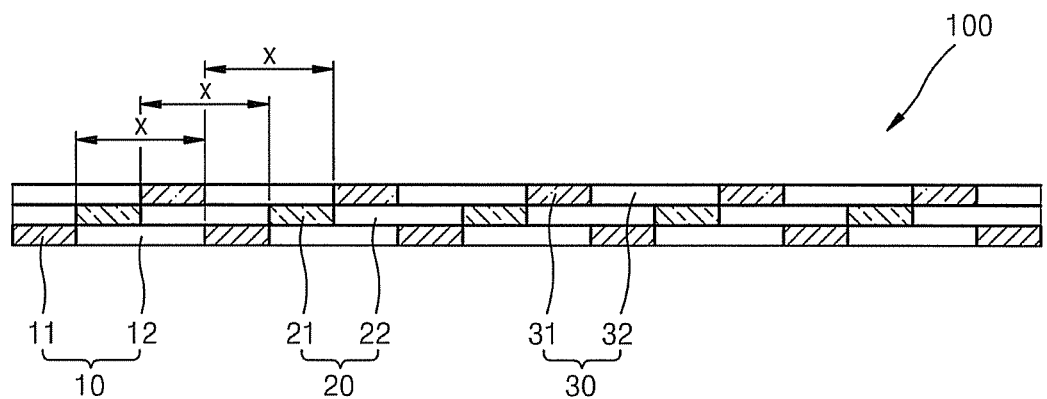
FIG. 2 is a cross-sectional view of the donor film of FIG. 1 along a line II-II.

FIG. 1 is a dissembled perspective view of a donor film 100 according to an embodiment of the present invention, and FIG. 2 is a cross-sectional view of the donor film 100 of FIG. 1 along a line II-II.

The donor film 100 is a stack structure including a first layer 10, a second layer 20, and a third layer 30. The first layer 10 has a first color, the second layer 20 has a second color, and the third layer 30 has a third color. For example, in the current embodiment, the first color may be red, the second color may be green, and the third color may be blue, but the present invention is not limited thereto. The first, second, and third colors may be set variously according to the features of a display apparatus which is to comprise the donor film.

The first layer 10, which is disposed in the bottom of the donor film 100, includes first transfer portions 11 and first opening portions 12. The first transfer portions 11 are required to transfer a light emitting material of the first color. Although not illustrated in the drawing, the first transfer portions 11 may include various layers such as a transfer layer, a base layer, a light-heat converting layer, and so forth.

The first transfer portion 11 includes a transfer layer for transferring the light emitting material of the first color. When forming an organic light emitting device, the transfer layer may be formed as a layer in order to form a hole injection layer, a hole transport layer, an organic light emitting layer, and electron injection layer, or other such layers of the organic light emitting device.

If the first color is red, in order to form a red organic light emitting layer, the transfer layer may include a red light emitting material such as tetraphenyinaphthacene (Rubrene), tris(1-phenylisoquinoline)iridium(III) ($Ir(piq)_3$), bis(2-benzo[b]thiophene-2-il-pyridine)(acetylacetonate)iridium(III) ($Ir(btp)_2(acac)$), tris(dibenzoylmethane)penanthrolin europium(III) ($Eu(dbm)_3(phen)$), tris[4,4'-di-tert-butyl-(2,2')-bipyridine]ruthenium(III) complex ($Ru(dtb-bpy)_3 * 2(PF_6)$), DCM1, DCM2, Eu(thenoyltrifluoroacetone)3 (Eu(TTA)3, butyl-6-(1,1,7,7-tetramethyljulolidyl-9-enyl)-4H-pyran (DCJTB), and also a polymer light emitting material such as polyfluorene-based polymer, polyvinyl-based polymer, etc.

Also, the first transfer portion 11 may include a base layer and a light-heat converting layer. The base layer transmits light to the light-heat converting layer, and to do such, the base layer includes a transparent material.

The light-heat converting layer absorbs light from an infrared ray-visible light region and converts a portion of the light into heat. Thus, the light-heat converting layer needs to have an appropriate optical density and be formed of a light-absorbing material. The light-heat converting layer may be a metal layer formed of Al, Ag, and an oxide or sulfide thereof or an organic layer formed of polymer including carbon black, graphite, or infrared ray dyes. The light-heat converting layer is disposed between the base layer and the transfer layer and transfers heat to the transfer layer.

The first transfer portions 11 may be patterned in stripes at predetermined distances from one another. In FIG. 2, the first transfer portions 11 are separated from each other at predetermined distances X. That is, the first transfer portions 11 are formed to correspond to sub-pixels having the first color when manufacturing a display apparatus using the donor film 100. The first transfer portions 11 may be formed to have a predetermined width. Since sub-pixels of a display apparatus are mostly formed to have a rectangular shape, the first transfer portions 11 may be formed in stripes to correspond to the rectangular shape of the sub-pixels.

However, the present invention is not limited thereto. That is, the first transfer portions 11 may have various shapes according to the shape of the sub-pixels of a display apparatus to be manufactured using the donor film 100. Also, the first transfer portions 11 may be separated at predetermined distances.

The first opening portions 12 are disposed in the space between the first transfer portions 11. In a subsequent process, the second transfer portions 21 of the second layer 20 and the third transfer portions 31 of the third layer 30 correspond to the first opening portions 12. That is, the second transfer portions 21 and the third transfer portions 31 are transferred to sub-pixels of a display apparatus through the first opening portions 12.

The shape of the first opening portions 12 varies according to the shape of the first transfer portions 11, and thus when the first transfer portion 11 are pattered in stripes, the first opening portions 12 are also patterned in stripes.

The second layer 20 is formed on the first layer 10. The second layer 20 includes second transfer portions 21 and second opening portions 22. The second transfer portions 21 are required to transfer a light emitting material of the second color.

The second transfer portion 21 includes a transfer layer transferring a light emitting material of a second color. When forming an organic light emitting device, the transfer layer may be formed as a layer for forming a hole injection layer, a hole transport layer, an organic light emitting layer, an electron injection layer, and so forth of the organic light emitting diode.

When the second color is green, in order to form a green organic light emitting layer, the transfer layer may include a green light emitting material such as 3-(2-benzothiazolyl)-7-(diethylamino)coumarin (Coumarin 6) 2,3,6,7-tetrahydro-1,1,7,7-tetramethyl-1H,5H,11H-10-(2-benzothiazolyl)quinolizino-[9,9a,1gh]coumarin (C545T), N,N'-dimethyl-quinacridone (DMQA), tris(2-phenylpyridine)iridium(III) (Ir(ppy)$_3$), and also a polymer light emitting material such as polyfluorene-based polymer, polyvinyl-based polymer, etc.

Also, the second transfer portion 21 may include a base layer and a light-heat converting layer. The base layer (not shown) transmits light to the light-heat converting layer (not shown). To this end, the base layer includes a transparent material.

The light-heat converting layer absorbs light from an infrared ray-visible light region and converts a portion of the light into heat. Thus, the light-heat converting layer needs to have an appropriate optical density and be formed of a light-absorbing material. The light-heat converting layer may be a metal layer formed of Al, Ag, and an oxide or sulfide thereof, or an organic layer formed of polymer including carbon black, graphite, or infrared ray dyes. The light-heat converting layer is disposed between the base layer and the transfer layer and transfers heat to the transfer layer.

The second transfer portions 21 may be patterned in as stripes at predetermined distances from one another. In FIG. 2, the second transfer portions 21 are separated from each other at predetermined distances X. That is, the first transfer portions 11 are formed to correspond to sub-pixels having the second color when manufacturing a display apparatus using the donor film 100. The second transfer portions 21 may be formed to have a predetermined width. Since sub-pixels of a display apparatus are mostly formed to have a rectangular shape, the second transfer portions 21 may be formed in stripes to correspond to the rectangular shape of the sub-pixels.

However, the present invention is not limited thereto. That is, the second transfer portions 21 may have various shapes according to the shape of the sub-pixels of a display apparatus to be manufactured using the donor film 100. Also, the second transfer portions 21 may be separated at predetermined distances.

The second transfer portions 21 are formed to correspond to the first opening portions 12 of the first layer 10. In detail, the second transfer portions 21 are formed smaller in size than the first opening portions 12 such that the second transfer portions 21 are respectively positioned within the range of the first opening portions 12 in a horizontal direction to the thickness direction of the second layer 20. The third transfer portions 31 of the third layer 30 to be described later are also disposed to correspond to the first opening portions 12, and thus the width of the second transfer portions 21 is determined according to the third transfer portions 31.

The second opening portions 22 are arranged in the space between the second transfer portions 21. In a subsequent process, the third transfer portions 31 are arranged to correspond to the second opening portions 22, and the third transfer portions 31 are transferred to sub-pixels of a display apparatus through the second opening portions 22.

Also, the second opening portions 22 may correspond to the first transfer portions 11. In this manner, it is prevented that the first transfer portion 11 and the second transfer portions 21 overlap with each other. The first transfer portions 11 and the second transfer portions 21 have different colors, and thus when they overlap with each other, they may affect the layers during a transfer process which is conducted by applying heat and the colors may become turbid or foreign substances may be left on the layers.

The shape of the second opening portions 22 varies according to the shape of the second transfer portions 21, and thus when the second transfer portions 21 are pattered in stripes, the second opening portions 22 are also patterned in stripes.

The third layer 30 is formed on the second layer 20. The third layer 30 includes third transfer portions 31 and third opening portions 32. The third transfer portions 31 are required to transfer a light emitting material of the third color.

The third transfer portion 31 includes a transfer layer transferring a light emitting material of the third color. When forming an organic light emitting device, the transfer layer may be formed as a layer for the purpose of forming a hole injection layer, a hole transport layer, an organic light emitting layer, an electron injection layer, and so forth of the organic light emitting diode.

When the third color is blue, in order to form a blue organic light emitting layer, the transfer layer may include a blue light emitting material such as oxadiazole dimer dyes (Bis-DAPOXP), spiro compounds (Spiro-DPVBi, Spiro-6P), triarylamine compounds, bis(styryl)amine (DPVBi, DSA), 4,4'-bis(9-ethyl-3-carbazovinylen)-1,1'-biphenyl (BCzVBi), perylene, 2,5,8,11-tetra-tert-butyl perylene (TPBe), 9H-carbazole-3,3'-(1,4-phenylene-di-2,1-ethene-diil)bis[9-ethyl-(9C)] (BCzVB), 4,4-bis[4-(di-p-tolylamino)styryl]biphenyl (DPAVBi), 4-(di-p-tolylamino)-4'-[(di-p-tolylamino)styryl] stilbene (DPAVB), 4,4'-bis[4-(diphenylamino)styryl]biphenyl (BDAVBi), bis(3,5-difluoro-2-(2-pyridyl)pheynyl-(2-carboxypyridyl)iridum III (FIrPic), and also a polymer light emitting material such as polyfluorene-based polymer, polyvinyl-based polymer, etc.

Also, the third transfer portion 31 may include a base layer and a light-heat converting layer. The base layer (not shown) transmits light to the light-heat converting layer. To this end, the base layer includes a transparent material.

The light-heat converting layer (not shown) absorbs light from an infrared ray-visible light region and converts a portion of the light into heat. Thus, the light-heat converting layer needs to have an appropriate optical density and be formed of a light-absorbing material for absorbing light. The light-heat converting layer may be a metal layer formed of Al, Ag, and an oxide or sulfide thereof, or an organic layer formed of polymer including carbon black, graphite, or infrared ray dyes. The light-heat converting layer is disposed between the base layer and the transfer layer and transfers heat to the transfer layer.

The third transfer portions 31 may be patterned in stripes at predetermined distances from one another. In FIGS. 1 and 2, the third transfer portions 31 are separated from each other at predetermined distances X, which, in the present embodiment, is equal to the predetermined distances X at which the first transfer portions 11 are separated, and is equal to the predetermined distances X at which the second transfer portions 21 are separated. That is, the third transfer portions 31 are formed to correspond to sub-pixels having the first color when manufacturing a display apparatus using the donor film 100. The third transfer portions 31 may be formed to have a predetermined width. Since sub-pixels of a display apparatus are mostly formed to have a rectangular shape, the third transfer portions 31 may be formed in stripes to correspond to the rectangular shape of the sub-pixels.

However, the present invention is not limited thereto. That is, the third transfer portion 31 may have various shapes according to the shape of the sub-pixels of a display apparatus to be manufactured using the donor film 100.

The third transfer portions 31 are formed to correspond to the first opening portions 12 of the first layer 10 and the second opening portions 22 of the second layer 20. The third transfer portions 31 are transferred to a display apparatus through the first opening portions 12 and the second opening portions 22.

The third opening portions 32 are disposed in the space between the third portions 31. The third opening portions 32 may correspond to the first transfer portions 11 and the second transfer portions 21. In this manner, it is prevented that the first transfer portions 11 and the second transfer portions 21 overlap with the third transfer portions 31. The first transfer portions 11 and the second transfer portions 21 have colors different from the third transfer portions 31, and thus when they overlap with one other, they may affect the layers during a transfer process which is conducted by applying heat, and the colors may become turbid or foreign substances may be left on the layers.

The shape of the third opening portions 32 varies according to the shape of the third transfer portions 31, and thus when the third transfer portions 31 are pattered in stripes, the third opening portions 32 are also patterned in stripes.

The donor film according to aspects of the present invention is formed as a stack structure so as to transfer the first, second, and third colors at the same time. The transfer portion of each layer are formed to correspond to the opening portions of the other layer, and thus the transfer portions can be easily transferred to each sub-pixel without being overlapped. Also, since the transfer portions do not overlap with one another, it is prevented that the transfer portions affect the other layers during a heating process.

Figure 3:
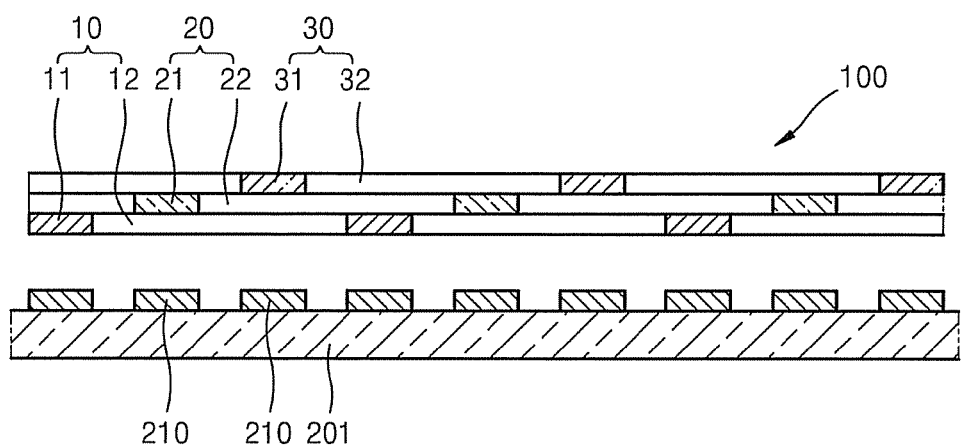
FIGS. 3 through 5 are cross-sectional views sequentially illustrating a method of manufacturing an organic light emitting device according to an embodiment of the present invention.
Figure 4:
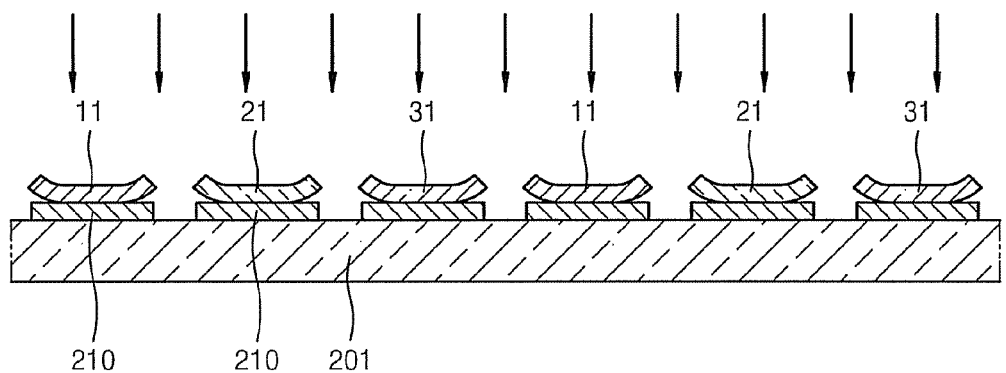
Figure 5:
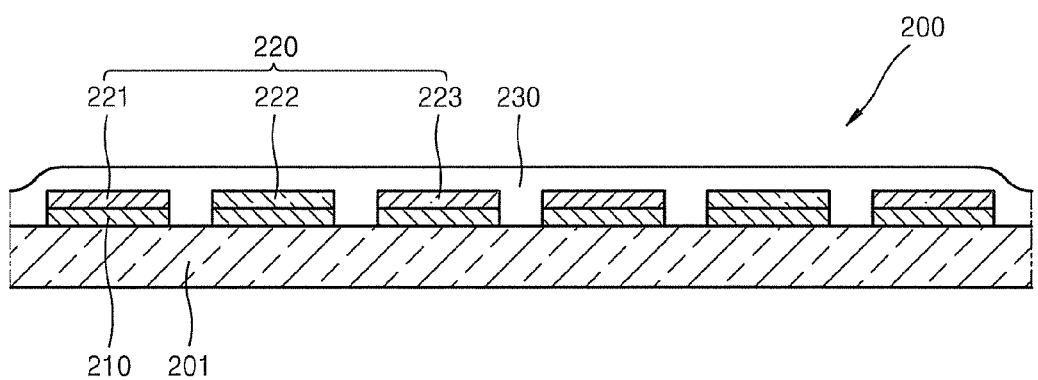

FIGS. 3 through 5 are cross-sectional views sequentially illustrating a method of manufacturing an organic light emitting device according to an embodiment of the present invention.

Referring to FIG. 3, a substrate 201 including first electrodes 210 and the donor film 100 illustrated in FIG. 1 are provided.

In detail, the substrate 201 may be formed of a transparent glass material having $SiO_2$ as a main component. However, the substrate 201 is not limited thereto, and may also be formed of a transparent plastic substrate. The plastic substrate may be formed of an insulating organic material, for example, one selected from the group consisting of polyethersulphone (PES), polyacrylate (PAR), polyetherimide (PEI), polyethylene napthalate (PEN), polyethylene terepthalate (PET), polyphenylene sulfide (PPS), polyallylate, polyimide, polycarbonate (PC), cellulose triacetate (TAC), and cellulose acetate propionate (CAP).

In a bottom emission type organic light-emitting display device in which an image is realized toward the substrate 201, the substrate 201 needs to be formed of a transparent material. However, in a top emission type organic light-emitting display device in which an image is realized away from the substrate 201, the substrate 201 may not necessarily be formed of a transparent material, and, in this case, the substrate 201 may be formed of a metal. When the substrate 201 is formed of a metal, the substrate 201 may include at least one material selected from the group consisting of carbon (C), iron (Fe), chromium (Cr), manganese (Mg), nickel (Ni), titanium (Ti), molybdenum (Mo), stainless steel (SUS), Invar alloys, Inconel alloys, and Kovar alloys. However, the present invention is not limited to the above examples, and thus the substrate 201 may also be formed of a metal foil.

Thin film transistors may be formed on the substrate 201 before forming the first electrodes 210. Obviously, the method of manufacturing an organic light emitting device may be applied not only to an active matrix type organic light emitting device but also to a passive matrix type organic light emitting device.

Referring to FIG. 3, the first electrodes 210 are formed on an upper surface of the substrate 201. The first electrodes 210 are formed as predetermined patterns using, for example, a photo lithography method. The first electrodes 210 may be formed as a transparent electrode or a reflective electrode. When formed as a transparent electrode, the first electrodes 210 may be formed of indium tin oxide (ITO), indium zinc oxide (IZO), ZnO, or $In_2O_3$. When formed as a reflective electrode, the first electrodes 210 may include a reflection layer formed of Ag, Mg, Al, Pt, Pd, Au, Ni, Nd, Ir, Cr or a compound of any of these, and a layer formed of ITO, IZO, ZnO, or $In_2O_3$, formed on the reflection layer.

The donor film 100 is arranged such that the first, second, and third transfer portions 11, 21, and 31 respectively correspond to the first electrodes 210. Then the donor film 100 is aligned.

In the conventional art, three sheets of donor film have to be transferred in order to transfer light emitting materials of three colors, and thus for every transfer of a donor film, the donor film needs to be aligned with first electrodes of the substrate, and thus the aligning process is performed three times in total. As a result, due to the errors generated in each of the aligning processes, it is difficult to precisely form sub-pixels through the transfer process. Also, while irradiating heat three times to transfer the donor film, impurities are left on the first electrodes 210 and the process time is lengthened.

However, according to the current embodiment of the present invention, one sheet of the donor film 100 having a stack structure is used to transfer light emitting materials of various colors by irradiating heat only once, and accordingly, the donor film 100 is aligned only once with respect to the first electrodes 210, thereby simplifying the aligning process and precisely adjusting the position of sub-pixels which are formed by the transfer process of the donor film 100.

FIG. 4 illustrates a case when heat is irradiated from above on the donor film 100. The heat source may be a laser. A mask and a lens may be arranged to irradiate heat onto desired positions of the donor film 100. Referring to FIG. 4, the transfer layers of each of the first transfer portions 11, the second transfer portions 21, and the third transfer portions 31 are transferred on the first electrodes 210.

Referring to FIG. 5, the first transfer portions 11, which are transferred by heat transfer form first intermediate layers 221 having the first color, and the second transfer portions 21 form second intermediate layers 222 having the second color, and the third transfer portions 31 forms a third intermediate layers 223 having the third color on the first electrodes 210.

According to the current embodiment of the present invention, an intermediate layer 220 including organic light emitting layers of sub-pixels of three colors can be formed by performing a heat transfer operation only once.

A second electrode 230 is formed over the intermediate layer 220 which is formed using a heat transfer method.

The second electrode 230 may be formed as a transparent electrode or a reflective electrode. When formed as a transparent electrode, the second electrode 230 may include a layer in which Li, Ca, LiF/Ca, LiF/Al, Al, Mg, or a compound of any of these is deposited toward the intermediate layer 220, and may also include a bus electrode line or an auxiliary electrode formed of ITO, IZO, ZnO, or $In_2O_3$. When formed of a reflective electrode, the second electrode 230 may be formed by depositing Li, Ca, LiF/Ca, LiF/Al, Al, Mg or a compound of any of these.

Although not illustrated in the drawing, a sealing member (not shown) may be disposed on the second electrode 230. The sealing member (not shown) is formed to protect the intermediate layer 220, etc., from water or oxygen from the outside, and is formed of a transparent material. To this end, the sealing member may be glass, plastics, or an overlapped structure of a plurality of organic and inorganic materials.

Figure 6:
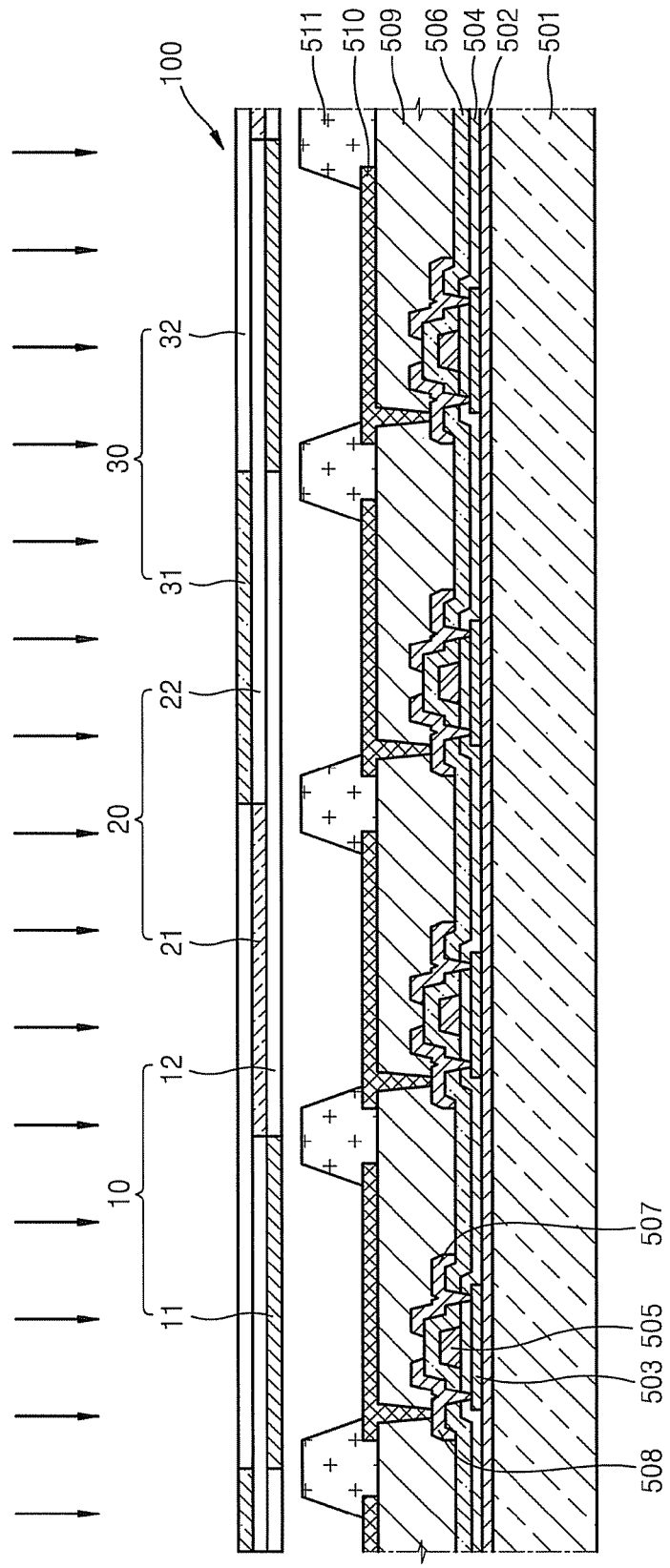
FIGS. 6 and 7 are cross-sectional views illustrating a method of manufacturing an organic light emitting display apparatus using the donor film of FIG. 1.
Figure 7:
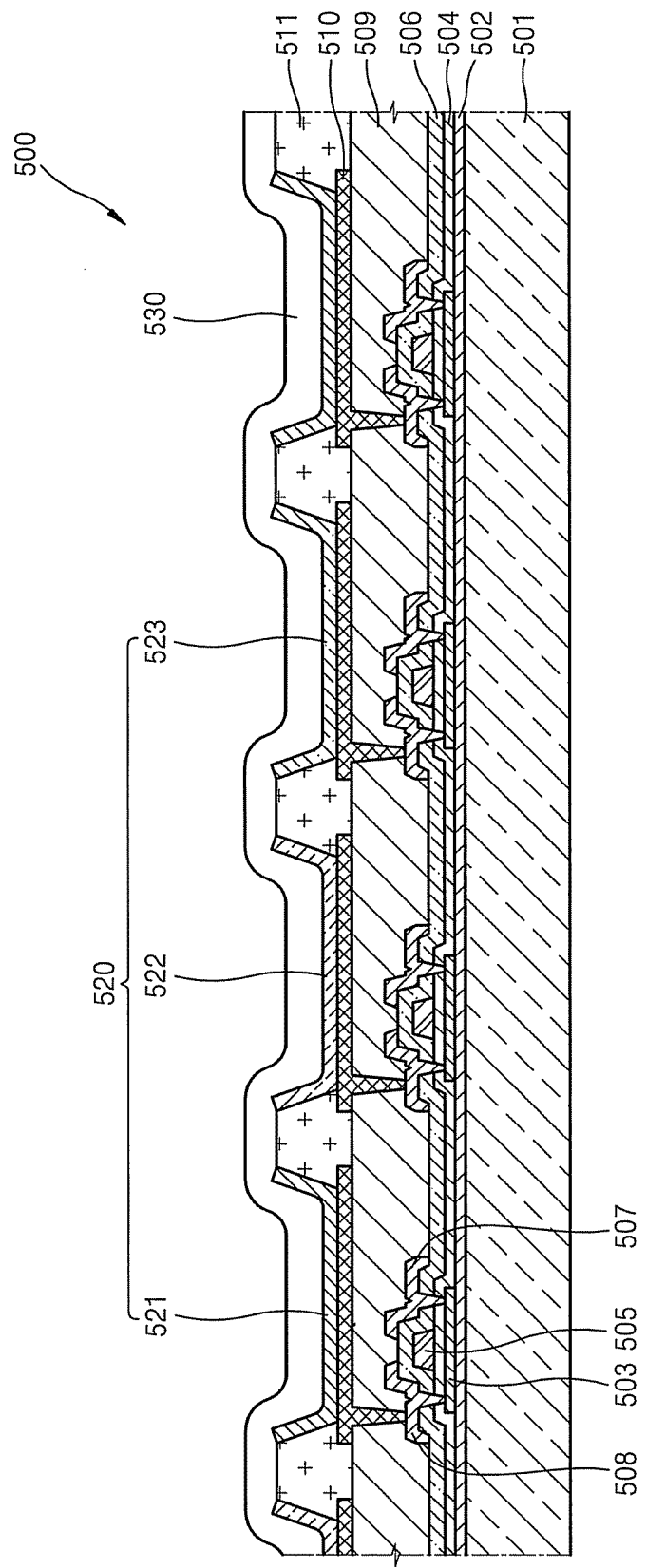

FIGS. 6 and 7 are cross-sectional views illustrating a method of manufacturing an organic light emitting display apparatus using the donor film of FIG. 1.

FIGS. 6 and 7 illustrate an active matrix type (AM) organic light emitting display apparatus. However, the present invention is not limited thereto, and may also be applied to a passive matrix type (PM) organic light emitting display apparatus.

Referring to FIG. 6, thin film transistors (TFT) are formed on a substrate 501, and first electrodes 510 connected to the TFTs are formed, and the donor film 100 illustrated in FIG. 1 is prepared.

The substrate 501 may be formed of a transparent glass material having $SiO_2$ as a main component. However, the substrate 501 is not limited thereto, and may also be formed of a transparent plastic substrate. The plastic substrate may be formed of an insulating organic material, for example, one selected from the group consisting of polyethersulphone (PES), polyacrylate (PAR), polyetherimide (PEI), polyethylene napthalate (PEN), polyethylene terepthalate (PET), polyphenylene sulfide (PPS), polyallylate, polyimide, polycarbonate (PC), cellulose triacetate (TAC), and cellulose acetate propionate (CAP).

In a bottom emission type organic light-emitting display apparatus in which an image is realized toward the substrate 501, the substrate 501 needs to be formed of a transparent material. However, in a top emission type organic light-emitting display apparatus in which an image is realized away from the substrate 501, the substrate 501 may not be necessarily formed of a transparent material, and, in this case, the substrate 501 may be formed of a metal. When the substrate 501 is formed of a metal, the substrate 501 may include at least one material selected from the group consisting of carbon (C), iron (Fe), chromium (Cr), manganese (Mg), nickel (Ni), titanium (Ti), molybdenum (Mo), stainless steel (SUS), Invar alloys, Inconel alloys, and Kovar alloys. However, the present invention is not limited to the above examples, and thus the substrate 501 may also be formed of a metal foil.

A smooth surface may be formed on the substrate 501 to form a buffer layer 502 on the substrate 501 in order to prevent penetration of impurities into the substrate 501. The buffer layer 502 may be formed of $SiO_2$ and/or $SiN_x$.

TFTs are formed on the buffer layer 502. At least one TFT is formed for each sub-pixel, and one of the TFTs is electrically connected to the first electrode 510 to operate as a driving circuit unit. In FIG. 6, four sub-pixels are illustrated for convenience of description, and TFTs functioning as driving circuit units for each sub-pixel are illustrated.

In detail, an active layer 503 having a predetermined pattern is formed on the buffer layer 502. The active layer 503 may be formed of an organic semiconductor or an inorganic semiconductor such as amorphous silicon or polysilicon, and includes a source region, a drain region, and a channel region.

The source and drain regions may be formed by doping impurities on the active layer 503 that is formed of amorphous silicon or polysilicon. A p-type semiconductor is formed by doping with a group 3 element such as boron (B), and an n-type semiconductor is formed by doping with a group 5 element such as nitrogen (N).

A gate insulating layer 504 is formed on the active layer 503, and a gate electrode 505 is formed in a predetermined region on the gate insulating layer 504. The gate insulating layer 504 is for insulating the active layer 503 and the gate electrode 505, and may be formed of an organic material or an inorganic material such as $SiN_x$ and $SiO_2$.

The gate electrode 505 may be formed of a metal or a metal alloy such as Au, Ag, Cu, Ni, Pt, Pd, Al, Mo, or Al:Nd, Mo:W alloys, but is not limited thereto, and may be formed of various materials in consideration of the adhesion property with adjacent layers, the flatness of stacked layers, electric resistance, and the processability of the various materials. The gate electrode 505 is connected to a gate line (not shown) that applies TFT on/off signals.

An interlayer insulating layer 506 including a contact hole is formed on the gate electrode 505. A source electrode 507 and a drain electrode 508 are formed to respectively contact the source and drain regions of the active layer 503 via the contact hole. The source electrode 507 and the drain electrode 508 are formed of Au, Pd, Pt, Ni, Rh, Ru, Ir, Os, etc., and also of alloys formed of two or more metals such as Al, Mo, Al:Nd alloy, and MoW alloy, but are not limited thereto.

The TFTs formed in this manner are protected by covering them with a passivation layer 509 formed of an insulating material. An inorganic insulating layer and/or organic insulating layer may be formed as the passivation layer 509. Examples of the inorganic insulating layer include $SiO_2$, $SiN_x$, SiON, $Al_2O_3$, $TiO_2$, $Ta_2O_5$, $HfO_2$, $ZrO_2$, BST, and PZT. Examples of the organic insulating layer include general, commonly-used polymers such as PMMA and PS, a polymer derivative including a phenol group, acrylic polymer, imide-based polymer, aryl ether-based polymer, amide-based polymer, fluorine-based polymer, p-xylene-based polymer, vinyl alcohol-based polymer, and blendings of these. The passivation layer 509 may have a complex stack structure formed of inorganic and organic insulating layers.

First electrodes 510 are formed on the passivation layer 509. The first electrode 510 is electrically connected to the drain electrode 508 through the via hole of the passivation layer 509. The first electrodes 510 are formed as predetermined patterns using, for example, a photo lithography method. The first electrodes 510 may be formed as a transparent electrode or a reflective electrode. When formed as a transparent electrode, the first electrodes 510 may be formed of indium tin oxide (ITO), indium zinc oxide (IZO), ZnO, or $In_2O_3$. When formed as a reflective electrode, the first electrodes 510 may include a reflection layer formed of Ag, Mg, Al, Pt, Pd, Au, Ni, Nd, Ir, Cr or a compound of any of these, and a layer formed of ITO, IZO, ZnO, or $In_2O_3$, formed on the reflection layer.

A pixel defining layer 511 is formed of an insulating material on the first electrode 510 to cover the first electrode 510. Then, a predetermined opening is formed in the pixel defining layer 511 to expose the first electrode 510.

The donor film 100 is arranged such that an intermediate layer including an organic light emitting layer can be formed above the first electrodes 510. A heat source (not shown) is arranged above the donor film 100 to irradiate heat to the donor film 100. The heat source may be a laser device. Also, in order to irradiate a laser to desired portions of the donor film 100, a mask (not shown) and a lens (not shown) may be disposed.

Referring to FIG. 6, the donor film 100 is arranged such that the first, second, and third transfer portions 11, 21, and 31 correspond to positions above the first electrodes 510. Then, the donor film 100 is aligned.

In the conventional art, three sheets of donor film have to be transferred in order to transfer light emitting materials of three colors, and thus every time when transferring a donor film, the donor film needs to be aligned with the first electrodes of the substrate, and thus the aligning process is performed three times. As a result, due to the errors generated in each of the aligning processes, it is difficult to precisely form sub-pixels through the transfer process.

Also, while irradiating heat three times to transfer the donor film, impurities are left on the first electrodes 510 and the process time is lengthened.

However, according to the current embodiment of the present invention, one sheet of the donor film 100 having a stack structure transfers light emitting materials of various colors by irradiating heat only once, and accordingly, the donor film 100 is aligned with the first electrodes 510 only once, thereby simplifying the aligning process and precisely adjusting the position of sub-pixels formed by the transfer process of the donor film 100.

Referring to FIG. 7, the transfer layers of each of the first transfer portions 11, the second transfer portions 21, and the third transfer portions 31 are transferred on the first electrodes 510. The first transfer portions 11 which are transferred by heat transferring form intermediate layers 521 having the first color, the second transfer portions 21 form intermediate layers 522 having the second color, and the third transfer portions 31 form intermediate layers 523 having the third color on the first electrodes 510.

According to the current embodiment of the present invention, an intermediate layer 520 including organic light emitting layers of sub-pixels having three colors may be formed by performing a heat transfer operation only once.

A second electrode 530 is formed on the intermediate layer 520 which is formed using a heat transfer method. The second electrode 530 may be formed as a transparent electrode or a reflective electrode. When formed as a transparent electrode, the second electrode 530 may include a layer in which Li, Ca, LiF/Ca, LiF/Al, Al, Mg, or a compound of any of these is deposited toward the intermediate layer 520, and may also include a bus electrode line or an auxiliary electrode formed of ITO, IZO, ZnO, or $In_2O_3$. When formed of a reflective electrode, the second electrode 530 may be formed by depositing Li, Ca, LiF/Ca, LiF/Al, Al, Mg or a compound of any of these.

A sealing member (not shown) may be disposed on the second electrode 530. The sealing member (not shown) is formed to protect the intermediate layer 520, etc., from water or oxygen from the outside, and is formed of a transparent material. To this end, the sealing member may be glass, plastics, or an overlapped structure of a plurality of organic and inorganic materials. According to the donor film and the method of manufacturing an organic light emitting device of aspects of the present invention, an organic light emitting layer can be easily formed.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A donor film, having a stacked structure, comprising:
a first layer comprising first opening portions and first transfer portions comprising a light emitting material of a first color;
a second layer on the first layer, the second layer comprising second opening portions and second transfer portions corresponding to the first opening portions, the second transfer portions comprising a light emitting material of a second color; and
a third layer on the second layer, the third layer comprising third opening portions and third transfer portions corresponding to the first opening portions and the second opening portions, the third transfer portions comprising a light emitting material of a third color.

2. The donor film of claim 1, wherein the second opening portions and the third opening portions are disposed on the first layer in a stacked direction of the donor film, the third opening portions are disposed on the second layer, the first opening portions are disposed under the second layer, and the first opening portions and the second opening portions are disposed under the third layer.

3. The donor film of claim 1, wherein the first transfer portions, the second transfer portions, and the third transfer portions are formed to not overlap with each other in a stacked direction of the donor film.

4. The donor film of claim 1, wherein the first transfer portions are patterned in stripes having first distances from each other,
wherein the first opening portions are between the first transfer portions,
wherein the second transfer portions are patterned in stripes having second distances from each other,
wherein the second opening portions are between the second transfer portions,
wherein the third transfer portions are patterned in stripes having third distances from each other, and
wherein the third opening portions are between the third transfer portions.

5. A method of manufacturing an organic light emitting device, the method comprising:
preparing the donor film of claim 1;
arranging the donor film on a substrate including first electrodes so that the donor film faces the first electrodes;
forming an intermediate layer by heating the donor film and transferring the first transfer portions, the second transfer portions, and the third transfer portions of the donor film; and
forming a second electrode on the intermediate layer.

6. The method of claim 5, wherein the second opening portions and the third opening portions are disposed on the first layer in a stacked direction of the donor film, the third opening portions are disposed on the second layer, the first opening portions are disposed under the second layer, and the first opening portions and the second opening portions are disposed under the third layer.

7. The method of claim 5, wherein the first transfer portions, the second transfer portions, and the third transfer portions are formed to not overlap with each other in a stacked direction of the donor film.

8. The method of claim 5, wherein the first transfer portions are patterned in stripes having first distances from one another, wherein the first opening portions are between the first transfer portions, wherein the second transfer portions are patterned in stripes having second distances from one another, wherein the second opening portions are between the second transfer portions, wherein the third transfer portions are patterned in stripes having third distances from one another, and wherein the third opening portions are between the third transfer portions.

9. The donor film of claim 1, wherein the first transfer portions have various shapes according to the shape of sub-pixels of a display apparatus.

10. The donor film of claim 1, wherein the first transfer portions, the second transfer portions, and the third transfer portions correspond to first electrodes.

11. The donor film of claim 9, wherein the shape of the first opening portions varies according to the shape of the first transfer portions.

12. The donor film of claim 4, wherein the first distances, the second distances, and the third distances are equal.

13. The method of claim 5, wherein the first transfer portions have various shapes according to the shape of sub-pixels of a display apparatus.

14. The method of claim 5, wherein the first portion, the second portion and, the third transfer portion correspond to the first electrodes.

15. The method of claim 13, wherein the shape of the first opening portions varies according to the shape of the first transfer portions.

16. The method of claim 8, wherein the first distances, the second distances, and the third distances are equal.

17. A method of manufacturing an organic light emitting device, the method comprising:
preparing one sheet of donor film, having a stacked structure, wherein the donor film comprises:
a first layer comprises first opening portions and first transfer portions comprising a light emitting material of a first color;
a second layer on the first layer, the second layer comprising second opening portions and second transfer portions corresponding to the first opening portions, the second transfer portions comprising a light emitting material of a second color;
a third layer on the second layer, the third layer comprising third opening portions and third transfer portions corresponding to the first opening portions and the second opening portions, the third transfer portions comprising a light emitting material of a third color;
arranging the donor film a single time on a substrate including first electrodes so that the donor film faces the first electrodes;
forming intermediate layers by heating the donor film only once and transferring the first transfer portions, the second transfer portions, and the third transfer portions of the donor film; and
forming a second electrode on the intermediate layers.

18. The method of claim 17, wherein the first transfer portions form intermediate layers having the first color, the second transfer portions form intermediate layers having the second color, and the third transfer portions form intermediate layers having the third color on the first electrodes.

19. The method of claim 18, wherein the intermediate layers includes organic light emitting layers of sub-pixels having three colors formed by performing a heat transfer operation only once.

20. The method of claim 17, wherein the second opening portions and the third opening portions are on the first layer in the stacked direction of the donor film, the third opening portions are on the second layer, the first opening portions are under the second layer, and the first opening portions and the second opening portions are disposed under the third layer.

21. The method of claim 17, wherein the first transfer portions, the second transfer portions, and the third transfer portions are formed to not overlap with each other in a stacked direction of the donor film.

22. The method of claim 18, wherein the first transfer portions are patterned in stripes having first distances from one another and the first opening portions are between the first transfer portions, the second transfer portions are patterned in stripes having second distances from one another and the second opening portions are between the second transfer portions, and the third transfer portions are patterned in stripes having third distances from one another and the third opening portions are between the third transfer portions.

23. The method of claim 17, wherein the first transfer portions have various shapes according to the shape of sub-pixels of a display apparatus.

24. The method of claim 17, wherein the first transfer portions, the second transfer portions and the third transfer portions correspond to the first electrodes.

25. The method of claim 23, wherein the shape of the first opening portions varies according to the shape of the first transfer portions.

26. The method of claim 22, wherein the first distances, the second distances and the third distances are equal are an equal predetermined distance.

27. A method of manufacturing an organic light emitting device (OLED), the method comprising:
concurrently transferring a donor film having a stacked structure to the OLED, the donor film comprising: a first layer comprising first opening portions and first transfer portions comprising a light emitting material of a first color; a second layer on the first layer, the second layer comprising second opening portions and second transfer portions corresponding to the first opening portions, the second transfer portions comprising a light emitting material of a second color; and a third layer on the second layer, the third layer comprising third opening portions and third transfer portions corresponding to the first opening portions and the second opening portions, the third transfer portions comprising a light emitting material of a third color.

28. The method of claim 27, further comprising:
arranging the donor film a single time on a substrate including first electrodes so that the donor film faces the first electrodes;
forming intermediate layers by heating the donor film only once and transferring the first transfer portions, the second transfer portions, and the third transfer portions of the donor film; and
forming a second electrode on the intermediate layers.

29. The method of claim 28, wherein the first transfer portions form intermediate layers having the first color, the second transfer portions form intermediate layers having the second color, and the third transfer portions form intermediate layers having the third color.

30. The method of claim 29, wherein the intermediate layers includes organic light emitting layers of sub-pixels having three colors formed by performing a heat transfer operation only once.

31. The method of claim 27, wherein the second opening portions and the third opening portions are disposed on the first layer in a stacked direction of the donor film, the third opening portions are disposed on the second layer, the first opening portions are disposed under the second layer, and the first opening portions and the second opening portions are disposed under the third layer.

32. The method of claim 27, wherein the first transfer portions, the second transfer portions, and the third transfer portions are formed to not overlap with each other in a stacked direction of the donor film.

33. The method of claim 28, wherein the first transfer portions are patterned in stripes having first distances from one another and the first opening portions are between the first transfer portions, the second transfer portions are patterned in stripes having second distances from one another and the second opening portions are between the second transfer portions, and the third transfer portions are patterned in stripes having third distances from one another and the third opening portions are between the third transfer portions.

34. The method of claim 27, wherein the first transfer portions have various shapes according to the shape of sub-pixels of a display apparatus.

35. The method of claim 28, wherein the first transfer portions, the second transfer portions and the third transfer portions correspond to the first electrodes.

36. The method of claim 35, wherein the shape of the first opening portions varies according to the shape of the first transfer portions.

37. The method of claim 33, wherein the first distances, the second distances and the third distances are equal.

* * * * *

UNITED STATES PATENT AND TRADEMARK OFFICE
CERTIFICATE OF CORRECTION

PATENT NO. : 8,349,416 B2  
APPLICATION NO. : 12/543638  
DATED : January 8, 2013  
INVENTOR(S) : Sang-Woo Pyo et al.

Page 1 of 1

It is certified that error appears in the above-identified patent and that said Letters Patent is hereby corrected as shown below:

In the Claims

Column 14, Claim 20, line 3          Delete "the stacked"
                                     Insert -- a stacked --

Column 14, Claim 26, lines 30-31     Delete "are an equal predetermined distance"

Signed and Sealed this  
Eighth Day of July, 2014

Michelle K. Lee  
*Deputy Director of the United States Patent and Trademark Office*